United States Patent [19]

Emmons

[11] 4,180,598

[45] Dec. 25, 1979

[54] RADIATION-CURABLE COATING COMPOSITIONS AND METHOD OF COATING METAL SUBSTRATES THEREWITH

[75] Inventor: William D. Emmons, Huntingdon Valley, Pa.

[73] Assignee: Rohm and Haas Company, Philadelphia, Pa.

[21] Appl. No.: 933,010

[22] Filed: Aug. 11, 1978

Related U.S. Application Data

[63] Continuation-in-part of Ser. No. 924,263, Jul. 13, 1978, abandoned.

[51] Int. Cl.$^2$ .............................................. B05D 3/06
[52] U.S. Cl. .................................. 427/44; 204/159.16; 427/53.1; 427/54.1; 560/205
[58] Field of Search ............................ 427/44, 53, 54; 560/205; 204/159.16, 159.22; 260/837 R

[56] References Cited

U.S. PATENT DOCUMENTS

| | | | |
|---|---|---|---|
| 3,266,930 | 8/1966 | Emmons et al. | 428/463 |
| 3,300,547 | 1/1967 | Gorman et al. | 260/881 |
| 3,759,807 | 9/1973 | Osborn et al. | 427/44 |
| 3,888,912 | 6/1975 | Burguette | 560/205 |
| 3,912,670 | 10/1975 | Huemmer et al. | 204/159.12 |
| 4,048,259 | 9/1977 | Wegemund et al. | 260/881 |

*Primary Examiner*—John H. Newsome
*Attorney, Agent, or Firm*—Lester E. Johnson

[57] ABSTRACT

The present invention is concerned with improvement in coating compositions that are curable by actinic radiation, such as ultraviolet, electron beam, or mercury arc radiation, and especially those that are rapidly cured at ambient temperature conditions while subjected to radiation in the ultraviolet wave length range from about 2,000 to about 5,000 Angstroms or longer. β-acryloxy-propionic acid is added to such compositions as part or all of the reactive diluent in the radiation curable compositions to impart improved adhesion of the cured coating to many substrates, especially to bare metals, such as aluminum, steel, copper, zinc, etc.

22 Claims, No Drawings

RADIATION-CURABLE COATING COMPOSITIONS AND METHOD OF COATING METAL SUBSTRATES THEREWITH

This application is a continuation-in-part of my copending application Ser. No. 924,263 filed July 13, 1978, which is now-abandoned.

BACKGROUND OF THE INVENTION

In the solvent-based coatings field wherein the composition that is applied for coating a substrate is a solution of a permanently thermoplastic vinyl copolymer in a non-reactive solvent that evaporates at the time of application, it has been a common practice to include small amounts of an acid monomer, such as maleic acid or acrylic acid in the mixture of monomers that is used to make the copolymer. See U.S. Pat. No. 3,037,955, example 1. This patent discloses that improvement in adhesion to bare metals is obtained when various free acids are added to the solution of the vinyl copolymer in small amounts of ½ to 3% by weight. U.S. Pat. No. 3,266,930 discloses the copolymerization of various vinyl and acrylic monomers with 0.5 to 10% by weight of an acid of the formula

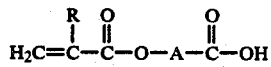

wherein R is H or $CH_3$ and A is an alkylene group having 1 to 3 carbon atoms. The resulting copolymer is dissolved in a solvent, applied to a substrate, and dried and cured by a conventional baking operation to develop adhesion to metal substrates.

U.S. Pat. No. 3,300,547 discloses anaerobic adhesive sealant compositions comprising acrylate ester monomers, a hydroperoxide catalyst, and certain adhesion imparting materials (polymers, especially polyester resins, e.g., 80/20 styrene/acrylate polymer, having a molecular weight between 2,000 and 40,000) which may also contain an adhesive promoter "characterized by the presence of a polymerizable terminal double bond or ethylenic linkage adjacent a polar functional group of the compound", or a mixture of such promoters. Among the adhesive promoting materials, the patent mentions the following acids and their anhydrides: crotonic, itaconic, nadic, methylnadic, acrylic, methacrylic, and maleic.

U.S. Pat. No. 4,048,259 discloses the addition of an ester-acid of the formula:

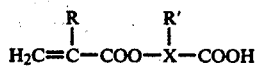

in which R is H or $CH_3$, R' is H, halogen, -COOH, -CN, or a $(C_1-C_8)$ alkyl group and X is a hydrocarbon group of 1 to 6 carbon atoms, to an anaerobic adhesive comprising a polymerizable acrylic ester and an organic peroxide polymerization initiator therefor to improve the adhesion to metals, such as steel. This patent in col. 2 lines 12 to 17, acknowledges U.S. Pat. No. 3,300,547 with the comment "However, carboxyl substituents have a corrosive action toward steel".

100% solids polymerizable radiation-curable coatings are increasingly penetrating the metal finishing industry, especially in the metal decorating and can coating area. They are non-polluting and require markedly less energy for cure than conventional solvent based baking systems. However, virtually all radiation cured coatings based on vinyl unsaturation (primarily acrylic) exhibit adhesion inferior to baked coatings. It is generally agreed that a major factor contributing to poor adhesion is internal stress created by the rapid shrinkage on polymerization. With a baked coating, oven temperature is usually above the glass temperature allowing internal mobility for stress relaxation and conformance to the microstructure of the substrate. The post-baking of a radiation cured coating has been applied (U.S. Pat. No. 3,856,744) and it generally improves adhesion.

In U.S. Pat. No. 3,912,670, radiation-curable coating compositions are provided which contain a radiation curable oil, a flow control additive and at least 20% by weight of acrylic acid as reactive solvent, with or without other reactive solvent. The use of at least 20% by weight of acrylic acid in the composition is stated to give unexpectedly high adhesion to metals, especially to untreated aluminum. However, acrylic acid is quite volatile, has a strong acrid odor (like vinegar) and is a strong acid, highly corrosive to steel at these use levels.

In U.S. Pat. No. 4,052,280, a UV sensitizer is incorporated into the backbone of a UV-curable ethylenically unsaturated polymer in a particularly spaced relationship away from the ethylenic unsaturation, thereby improving adhesion to the substrate on radiation curing.

The reaction product of a hydroxyalkyl acrylate with a cyclic anhydride has been suggested as an adhesion-promoter in radiation-curable coatings (B. Trathnigg and J. Wendrinsky, Farbe and Lack, 82(2), 100 (1976).

In U.S. Pat. No. 3,943,103, the dissolution of a low molecular weight vinyl acetate polymer in a radiation-curable composition containing a polyfunctional reactive compound containing at least two radiation-curable polymerizable

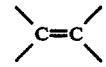

groups and optionally a monofunctional reactive compound having one such group is claimed to improve adhesion to metals.

DESCRIPTION OF THE INVENTION

According to the present invention, the addition of a small amount (0.5% to 25% by weight) of 3-acryloxypropionic acid of the formula:

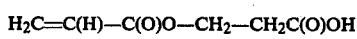

which specific compound is hereinafter referred to as AOPA to certain radiation-curable coating compositions has been found to markedly improve the adhesion of the cured compositions to various substrates, especially to bare metals. The specific compound defined above is also known as β-acryloxypropionic acid.

Preferred radiation-curable coating compositions comprise (a) one or more ethylenically unsaturated monomers having at least one terminally unsaturated group of the formula $H_2C=C<$ and/or (b) at least one oligomeric, that is a low molecular weight, vinyl addition polymer of at least one monoethylenically unsaturated monomer having one terminal group of the formula $H_2C=C<$, and/or (c) at least one acrylated oligomeric condensation or addition product having at least one, and preferably at least two, terminal or pendant acryloxy group(s) of the formula H₂C=C(H)—C-(O)O—. A photosensitizer or photoinitiator in a small but effective amount, and optionally an amine activator in a small but effective amount may be included in the coating compositions when curing is to be effected by exposing the compositions to ultraviolet and/or visible radiation.

The ethylenically unsaturated monomers that can be used in the compositions include ethylene, styrene, acrylic or methacrylic acid esters, such as 2-ethylhexyl acrylate, isobornyl acrylate, ethoxyethoxyethyl acrylate, dicyclopentenyl methacrylate, dicyclopentenyl acrylate, dicyclopentenyloxyethyl acrylate, dicyclopentenyloxyethyl methacrylate, ethylene glycol diacrylate, neopentyl glycol diacrylate, 1,4-butanediol diacrylate, 1,6-hexanediol diacrylate, pentaerythritol tri- and tetra-acrylate, trimethylolpropane triacrylate, any ($C_8$–$C_{20}$) alkyl acrylate, any ($C_8$–$C_{20}$) alkenyl acrylate, such as oleyl acrylate, linoleyl acrylate, and linolenyl acrylate, a vinyl ester of any ($C_{10}$–$C_{20}$) alkanoic acid, any di-($C_4$ to $C_8$) alkyl maleate, fumarate, or itaconate, such as dibutyl maleate. Any of the monomers mentioned in col. 6, line 25 to col. 7 line 49 of U.S. Pat. No. 3,759,807 may be used in the coating compositions to be cured by actinic radiation in accordance with the present invention. Oligomers and cooligomers of one or more of the monomers mentioned may also be used alone or in admixture with one or more of the monomers mentioned hereinabove or in the passage of the patent just mentioned.

In addition, there may be used as one component of the coating composition, an acrylated condensation polymer having at least one, preferably two or more acryloxy-capped groups. Examples of such radiation-curable condensation polymers are the following:

(A) Urethane (meth)acrylates obtained by reacting isocyanate groups of a polyisocyanate, such as hexamethylene diisocyanate with a hydroxyalkyl (meth)acrylate, e.g. hydroxyethyl acrylate. These polyurethane poly (meth)acrylate monomers are disclosed in U.S. Pat. No. 3,297,745.

(B) Polyether (meth)acrylates obtained by esterification of hydroxy-terminated polyethers with acrylic or methacrylic acid as disclosed in U.S. Pat. No. 3,380,831.

(C) Polyesters having at least two (meth)acrylate groups obtained by esterifying hydroxyl groups with (meth)acrylic acid as disclosed in U.S. Pat. No. 3,935,173.

(D) Polyfunctional (meth)acrylates disclosed in U.S. Pat. No. 3,560,237, e.g. obtained by reaction of a hydroxyalkyl (meth)acrylate, e.g. hydroxyethyl acrylate, with any one of:

(a) Dicarboxylic acids having from 4 to 15 carbon atoms,
(b) Polyepoxides having terminal glycidyl groups,
(c) Polyisocyanates having terminal reactive isocyanate groups.

(E) (Meth)acrylate-terminated polyesters made from (meth)acrylic acid, a polyol having at least three hydroxyl groups, and a dicarboxylic acid (U.S. Pat. No. 3,567,494).

(F) Poly(meth)acrylates obtained by the reaction of (meth)acrylic acid with at least two epoxy groups of epoxidized drying oils, such as soybean oil, linseed oil, and the like, e.g. epoxidized corresponding drying oil fatty acid, an ester or amide thereof, or the corresponding alcohol, containing at least two epoxy groups. Such polyfunctional (meth)acrylates are disclosed in U.S. Pat. No. 3,125,592.

(G) Poly(meth)acrylates which are urethane or amine derivatives of the poly(meth)acrylated epoxidized drying oils, fatty acids and the like described in F) and U.S. Patent mentioned therein, obtained by the reaction of isocyanate(s) or amine(s) respectively with the poly(meth)acrylated epoxidized drying oils, fatty acids, and the like described in U.S. Pat. No. 3,125,592. The urethane and amine derivatives retain some or all of the (meth)acrylate groups and are disclosed in U.S. Pat. Nos. 3,876,518 and 3,878,077.

(H) Poly(meth)acrylates obtained by reaction of (meth)acrylic acid by addition to the epoxy groups of aromatic bisphenol-based epoxy resins as disclosed in U.S. Pat. No. 3,373,075.

(I) Poly(meth)acrylates obtained by the addition of (meth)acrylic acid to a linear vinyl polymer having pendant glycidyl groups, e.g. polymers of glycidyl (meth)acrylate or of vinyl glycidyl ether or vinyl glycidyl sulfide as disclosed in U.S. Pat. No. 3,530,100.

(J) Polyfunctional (meth)acrylates derived from (meth)acrylic acid anhydride and polyepoxides as disclosed in U.S. Pat. No. 3,676,398.

(K) Polyfunctional (meth)acrylate urethane esters obtained from the combining of hydroxyalkyl (meth)acrylates, a diisocyanate, and a hydroxyl functional alkyd condensate as disclosed in U.S. Pat. No. 3,673,140.

(L) (Meth)acrylate terminated urethane polyesters obtained by reaction of a polycaprolactone diol or triol with an organic polyisocyanate, e.g., a diisocyanate, and a hydroxyalkyl (meth)acrylate. Such products are disclosed in U.S. Pat. No. 3,700,643.

(M) Urethane poly(meth)acrylates obtained by reaction of a hydroxyl-containing ester of a polyol with (meth)acrylic acid and a polyisocyanate, such as those described in U.S. Pat. No. 3,759,809.

The disclosure in the patents mentioned above in each of the paragraphs (A) through (M) are incorporated herein by reference insofar as they disclose the poly(meth)acryloxy-containing compounds and the processes of making them.

Preferred polyfunctional unsaturated compounds of the "complex" type above for use in the coating compositions are the acrylic acid adducts to polyepoxides in which the epoxy group is attached to adjacent carbon atoms, that is the epoxy group is a vic-epoxy group. The polyepoxide may be any epoxidized vegetable or animal oil having ten or more carbon atoms in the fatty acid component and sufficient unsaturation to provide at least two epoxy groups in the epoxidized oil. Drying oils or semi-drying oils such as linseed oil or soybean oil are especially useful for epoxidation and subsequent acrylation. The polyepoxide to be acrylated may be any resin-forming polyepoxide having at least two terminal groups of the formula,

obtainable by reacting epichlorohydrin and a polyhydroxy phenol or an aliphatic diol or polyol, e.g. bisphenol A, glycerol, glycol, diethylene glycol, hexamethylene glycol and the like. Low molecular weight vinyl addition copolymers of glycidyl vinyl ether and of glycidyl (meth)acrylate may also be acrylated to form acrylated polyepoxides.

The compositions may also contain a photosensitizer (or photoinitiator). Examples thereof that may be used include selected acyloins or derivatives thereof, for example, benzoin alkyl ethers, such as benzoin methyl ether and benzoin ethyl ether, desyl halides, such as desyl bromide and desyl chloride, desyl amine, benzophenone derivatives, acetophenone compounds, polychlorinated aromatic compounds, combination of organic carbonyls and amines or mixtures thereof. The acetophenone photoinitiators are disclosed in U.S. Pat. No. 3,715,293. The combination of organic carbonyls and amines is disclosed in U.S. Pat. No. 3,759,807 the disclosures of these patents are hereby incorporated by reference. The proportion of photosensitizer is from 0.1 to 5 weight % of the composition and when an amine activator is used with the organic carbonyl photosensitizer it also is used in an amount from 0.1 to about 5 weight %.

Preferred coating compositions to which the AOPA is added in small amounts to improve adhesion, especially to bare metals, that is unprimed metals, e.g. of aluminum, aluminum alloy, and low carbon steels, are 100% solids compositions comprising binder-forming components consisting essentially of:

(a) About 10 to 90 weight percent of at least one ethylenically unsaturated essentially non-volatile reactive liquid monomer having at least one terminal unsaturated group, $H_2C=C<$, and from 10 to 90 weight percent of an oligomer having a weight average molecular weight of about 600 to about 20,000 selected from the group consisting of:

(b) a vinyl addition polymer of at least one monoethylenically unsaturated monomer having one terminal unsaturated group, $H_2C=C<$ and (c) an acrylated condensation or addition product having at least one, preferably at least two, terminal or pendant unsaturated acryloxy group(s) of the formula $H_2C=CH—C(O)O—$, the component (a) serving as a reactive solvent (or diluent) for the oligomer (b) and/or (c).

By the term "non-volatile" or "essentially non-volatile" as applied to the reactive monomer(s), it is intended herein that the reactive monomer or mixture thereof must have a vapor pressure/reactivity balance under the conditions of cure, ambient or force-dry, such that no more than 5 weight % of reactive monomer is lost by evaporation during curing of the film coatings formed from the compositions of the present invention.

Besides the reactive monomer (a) and the low molecular weight polymer (b) and/or the acrylated condensation product (c) the composition to which AOPA is added, may contain (d) 0.1 to 5% by weight of a photosensitizer and (e) 0.1 to 5% by weight of an amine activator. When components (d) and (e) are used together, any of the organic carbonyl photosensitizers and any of the amine activators listed in U.S. Pat. No. 3,759,807 may be used. The disclosure in that patent from column 1, line 56 through columns 2 to 9 inclusive and through column 10, line 65 (concerned with organic carbonyl sensitizers, amine activators, radiation sources that can be used, monomers, oligomers, condensation products that can be acrylated and used, the method of preparing the composition blend, especially the 100% solids compositions applying it to various substrates, and the curing by radiation) is incorporated herein by reference.

The AOPA may be added to the coating composition in a small amount in the range of 0.5 to 25%, preferably about 1 to 15%, by weight, based on the total weight of binder components (a), (b) and (c). The AOPA is reactive with the other binder components and forms part of the cured product. It, therefore, can be considered to form part of the reactive monomer (a) content of the composition.

As compared to acrylic acid used in an amount of at least 20% by weight of the radiation-curable composition in the earlier U.S. Pat. No. 3,912,670, the AOPA is far less volatile and suffers lower loss during curing. Because such lower levels of AOPA can be used there is less corrosive effect on the bare metal surfaces, e.g., steel, that are coated. Also, the AOPA is better from the environmental and ecological standpoints since it has a much milder odor than acrylic acid. Yet, when AOPA is used, better adhesion is generally attainable with a smaller proportion of AOPA in the composition than the proportion of acrylic acid that must be added to the coating composition to obtain comparable improvement in adhesion.

The coating composition to which a small amount of AOPA is added is applied in any suitable way, by brushing, roll-coating, spraying, to the surface of the metal substrate which is then passed through a zone of radiation to effect curing of the coating layer, which generally is adequately accomplished in a period of about 1 to 30 seconds depending on the intensity of the source of radiation and its closeness to the coating as it passes through the radiation zone in which it is exposed to light radiation having wave lengths of about 2,000 to about 5,000 angstroms or higher. The light radiation may be ultraviolet light generated by low, medium, or high pressure mercury lamp. It is also contemplated in this invention that curing of the coating layer may be effected by exposing the coating composition to electromagnetic radiation having a wave length of about 200 to 800 nanometers or to accelerated electron beams having energy of about 100 keV to 500 keV at a total dose of about 0.1 to 100 Mrads. When such alternative (to ultraviolet) radiation sources are used, the use of a photosensitizer in the coating composition is not required. Any of the light sources described in U.S. Pat. No. 3,759,807 may be used for curing the coated substrates.

Furthermore, any of the carbonyl photosensitizers disclosed in U.S. Pat. No. 3,759,807 may be used in combination with the amine activators mentioned in that patent.

The following examples are illustrative of the invention. In the examples the substrates coated are coded as follows:

| Code | Definition |
| --- | --- |
| UA | Untreated aluminum: Type A bare alloy 3003 H14, Federal Test Std. No. 141, Method 2013; 0.025" (from Q-Panel Company). |
| AA | Alodined aluminum: Type AL above treated with Alodine 1200S chrome oxide, MIL-C-5541. (Q-Panel Company). |
| SS | Smooth steel: Cold Rolled Steel, SAE 1010 Low Carbon, Type QD, 0.020", smoothness 8-12 mu; ASTM D609.3B, Fed. Test Std. No. 141, Method 2011 (Q-Panel Company). |
| MS | Matte steel: as above but Type R, 0.032", smoothness 35-50 mu; ASTM D609.2B, same Fed. Test Std. (Q-Panel Company). |
| BS | Bonderite Steel: Cold Rolled Steel, 24 Guage with Bonderite$^R$ 1000 Iron Phosphate Coating (Parker Company). |

-continued

| Code | Definition |
|------|------------|
| GS | Ground Steel: Cold Rolled Steel, SAE 1010 Low Carbon; Type S, 0.032", smoothness 15-25 m; ASTM D609.2B, Fed. Test Std. No. 141, Method 2011 (Q-Panel Company). |

Various components of the coating are coded as follows:

| Code | Component (a) Reactive Diluent Monomers |
|------|------------------------------------------|
| M1 | isobornyl acrylate |
| M2 | 2-ethylhexyl acrylate |
| M3 | ethoxyethoxyethyl acrylate |
| M4 | dicyclopentenyloxyethyl acrylate |
| M5 | dicyclopentenyloxyethyl methacrylate |
| Code | Components (d) & (e) Photoinitiator Components* |
| DEAP | α,α-diethoxyacetophenone |
| BP | benzophenone |
| MDEA | methyl diethanol amine |
| Code | Component (c) Acrylate Functional Oligomers |
| A | A polyfunctional acrylated epoxidized soybean oil with an oil-like character. It is a clear yellow liquid of specific gravity 1.069 40/20° C., pour point 95° F., viscosity of 18,600/2,800/700 cps. at 40°/80° C. respectively, and has an acrylate content of 2.8 milliequivalents per gram (available as Ucar$^R$ Actomer X-80, Union Carbide). |
| B | The diacrylate ester of a liquid bisphenol A epoxy resin having a viscosity of about 9,000 poises at 77° F. and a density of about 10.0 lb/gal. (available as Epocryl$^R$ Resin DRH-370, Shell Chemical Co.). |
| C | An acrylate functional polyurethane based resin having a viscosity of about 30,000 cps at 50° C., a specific gravity of 1.08, and an unsaturation of 1.2 milliequivalents per gram (available as Castomer$^R$ U-0100, Witco Chemical Co.). |
| D | An acrylate functional polyurethane, the condensate of a polyol, a diisocyanate, and a hydroxyalkyl acrylate. It is supplied as a 67% solution in 2-ethoxyethyl acrylate with a viscosity of 1.8-2.2 poises and a density of 9.1 lb/gal. (available as Uvimer$^R$ 775, Polychrome Corp.). |
| E | A vinyl modified unsaturated polyester resin. The polyester resin is the condensate of maleic anhydride and ethoxylated bisphenol A terminated with vinyl groups attached by urethane linkages (available as Atlac$^R$ 580, ICI United States). |

*See U.S. 3,715,293 and 3,801,329

Coating Sample Preparation

In all of the examples, the coating ingredients as given in parts by weight were mixed until clear and homogeneous. The coatings were applied with a #30 wire-wound rod to yield about 1.5 mil film thickness, and were cured in air with an Ashdee Company 25H Laboratory UV Curing Unit at a distance of 6 inches under two 200 w/in. Hanovia medium pressure mercury lamps for 4 passes at a conveyor speed of 30 ft/min.

Adhesion Testing

Tape crosshatch adhesion test was performed according to ANSI/ASTM D3395-76, Method B (11 cuts). Adhesion values given as percent of coating remaining in test grid.

EXAMPLES 1-17

These examples (See test results in Table I) demonstrate the adhesion promoting characteristics of AOPA over a variety of metal substrates in test formulations containing 40 parts by weight of oligomer A with 60 parts by weight of the diluent specified in the table. Two parts by weight of DEAP was used in all of the examples in Table I but it was supplemented by 0.8 part by weight of BP in examples 1 and 2. The entry in the third column under the heading AOPA specifies the amount of AOPA added in parts by weight.

Untreated aluminum is especially difficult to adhere to, yet good results can be achieved with proper selection of reactive diluent, e.g., M1 and M5.

Table I

| Ex. | Diluent | AOPA | Adhesion to Substrate* ||||||
|-----|---------|------|----|----|----|----|----|----|
|     |         |      | UA | AA | SS | MS | GS | BS |
| 1   | M5 | 0  | 50  | 100 | 20  | 80  | 80  | 90 |
| 2   | M5 | 2  | 100 | 100 | 100 | 100 | 100 | >95 |
| 3   | M1 | 0  | 25  | 0   | <10 | 20  | 30  | 10 |
| 4   | M1 | 2  | 75  | <10 | 100 | 100 | 100 | 80 |
| 5   | M1 | 8  | >95 | 100 |     |     |     |    |
| 6   | M1 | 15 | >95 | 100 |     |     |     |    |
| 7   | M4 | 0  | 0   | <10 | 0   |     |     | <10 |
| 8   | M4 | 2  | 10  | 35  | 15  |     |     | 40 |
| 9   | M4 | 4  | 0   | 50  | 0   |     |     | 40 |
| 10  | M4 | 8  | 10  | 100 | 30  |     |     | 70 |
| 11  | M2 | 0  | 0   | <10 | 0   |     |     | 75 |
| 12  | M2 | 2  | 10  | 80  | <10 |     |     | 80 |
| 13  | M2 | 8  | 20  | 100 | 35  |     |     | 90 |
| 14  | M3 | 0  | 0   | 0   | 0   |     |     | 0 |
| 15  | M3 | 2  | 0   | 30  | <10 |     |     | 20 |
| 16  | M3 | 4  | <10 | 80  | 15  |     |     | 45 |
| 17  | M3 | 8  | 0   | 30  | 20  |     |     | 100 |

*Substrates were cleaned by wiping with toluene-wet paper towels prior to application of coatings.

EXAMPLES 18-21

In these examples, the formulations all contain 40 parts of oligomer B, 60 parts of a 50/50 weight ratio mixture of diluents M3 and M4, 2 parts of DEAP and the amount of AOPA given in Table II.

TABLE II

| Ex. | AOPA | Adhesion to Substrate* |||
|-----|------|-----|-----|-----|
|     |      | AA  | SS  | MS  |
| 18  | 0    | 10  | 0   | 0   |
| 19  | 2    | 60  | 0   | 45  |
| 20  | 4    | 50  | 0   | 35  |
| 21  | 8    | 50  | 10  | 90  |

*Substrates used as received.

EXAMPLES 22-25

In these examples, the formulations have the compositions shown in Table III except 2 parts by weight of DEAP is added in each example.

TABLE III

| Ex. | Coating Composition Parts by Weight || | Adhesion to Substrate* |||
|-----|---------|---------|------|----|-----|-----|
|     | Oligomer | Diluent | AOPA | UA | AA  | SS  |
| 22  | 60C | 40 M1 | 0 | 5  | 100 | <10 |
| 23  | 60C | 40 M1 | 2 | 35 | 100 | 25  |
| 24  | 70D | 30 M1 | 0 | 0  | 25  | 0   |
| 25  | 70D | 30 M1 | 2 | 75 | 100 | 100 |

*Substrates cleaned by wiping with toluene-wet paper towel prior to application of coatings.

EXAMPLES 26-29

The formulations used in these examples correspond to those used in Examples 7 through 10 inclusive except that 40 parts of oligomer E is used instead of 40 parts of oligomer A. Table IV lists the results of these tests.

TABLE IV

| Ex. | AOPA | Adhesion to Substrate* | | | |
|-----|------|------|------|------|------|
|     |      | UA | AA | SS | MS |
| 26 | 0 | 0 | 0 | 0 | 15 |
| 27 | 2 | 0 | 95 | 0 | 95 |
| 28 | 4 | 0 | 95 | 0 | 95 |
| 29 | 8 | 85 | 95 | 95 | 95 |

*Substrates used as received.

It is to be understood that changes may be made without departing from the spirit and scope of the invention as defined in the appended claims.

What is claimed is:

1. A readiation-curable composition, characterized by improved adhesion to metal substrates, having a film-forming binder consisting essentially of:
   (A) At least one ethylenically unsaturated monomer selected from the group consisting of isobornyl acrylate, 2-ethylhexyl acrylate, ethoxyethoxyethyl acrylate, dicyclopentenyloxyethyl acrylate and dicyclopentenyloxyethyl methacrylate, and
   (B) At least one acrylated oligomeric condensation or addition product having at least two terminal or pendant acryloxy groups of the formula $H_2C=C(H)C(O)O-$, and about 1% to 15% by weight, based on the total weight of (A) and (B), of 3-acryloxypropionic acid.

2. A composition according to claim 1 further comprising a photosensitizer in a small but effective amount, and optionally an amine activator in a small but effective amount.

3. A composition according to claim 1 or 2 in which the oligomer is an acrylated epoxidized soybean oil.

4. A composition according to claim 3 in which component (A) comprises isobornyl acrylate.

5. A composition according to claim 3 in which component (A) comprises dicyclopentenyloxyethyl methacrylate.

6. A composition according to claim 3 in which component (A) comprises dicyclopentenyloxyethyl acrylate.

7. A composition according to claim 3 in which component (A) comprises 2-ethylhexyl acrylate.

8. A composition according to claim 3 in which component (A) comprises ethoxyethoxyethyl acrylate.

9. In a radiation-curable coating composition having a film-forming binder comprising unsaturated monomeric and oligomeric components (A) and (B), as defined in claim 1, the improvement which consists in the incorporation therein of about 2 to 8 weight percent, based on the total weight of (A) and (B), of 3-acryloxypropionic acid to improve the adhesion of the cured coating to metal substrates on which they are cured by radiation.

10. A method for coating a metal substrate, which comprises preparing a radiation-curable composition as defined in claim 1, applying a thin film of the composition to the surface of a substrate, and then subjecting the film to actinic radiation for a length of time sufficient to cure the film.

11. A composition according to claim 1 wherein the weight ratio of (A) to (B) is from 10:90 to 90:10 and the amount of 3-acryloxypropionic acid is from about 2 to 8% by weight, based on the total weight of (A) and (B).

12. A composition according to claim 11 which is a 100% solids composition.

13. A composition according to claim 12 wherein the component (A) consists essentially of at least 1 monomer selected from the group consisting of isobornyl acrylate, ethoxyethoxyethyl acrylate, dicyclopentenyloxyethyl acrylate, and dicyclopentenyloxyethyl methacrylate.

14. A composition according to claim 12 wherein (A) consists essentially of isobornyl acrylate.

15. A composition according to claim 12 wherein (A) consists essentially of dicyclopentenyloxyethyl acrylate.

16. A composition according to claim 11 wherein the composition may comprise a photosensitizer in an effective amount of at least 0.1% by weight of the total weight of (A), (B), and 3-acryloxypropionic acid.

17. A method according to claim 10 wherein the radiation is effected by an electron beam.

18. A method for coating a metal substrate which comprises preparing a radiation-curable composition according to claim 11, applying a thin film of the composition to the surface of the metal, and then subjecting the film to actinic radiation for a length of time sufficent to cure the film.

19. A method according to claim 18 wherein the radiation-curable composition is a 100% solids composition as defined in claim 14.

20. A method according to claim 19 in which the radiation is that of an electron beam.

21. A method according to claim 19 in which the radiation is effected by light having a wave length or a band of wave lengths in the range of about 2,000 to 5,000 Angstroms.

22. A composition according to claim 1 or 11 wherein the acrylated oligomeric product is a poly(meth)acrylate obtained by the reaction of (meth)acrylic acid by addition to epoxy groups of a bisphenol-based epoxy resin.

* * * * *

UNITED STATES PATENT AND TRADEMARK OFFICE
CERTIFICATE OF CORRECTION

PATENT NO. : 4,180,598
DATED : December 25, 1979
INVENTOR(S) : William D. Emmons It is certified that error appears in the above-identified patent and that said Letters Patent are hereby corrected as shown below:

In claim 3, line 1 change "claim 1 or 2" to "claim 1 or 11".

Signed and Sealed this

Twenty-second Day of July 1980

[SEAL]

Attest:

SIDNEY A. DIAMOND

Attesting Officer

Commissioner of Patents and Trademarks